(12) United States Patent
Korolenko et al.

(10) Patent No.: US 11,439,045 B2
(45) Date of Patent: Sep. 6, 2022

(54) CHASSIS STRUCTURE

(71) Applicant: YANDEX EUROPE AG, Lucerne (CH)

(72) Inventors: Andrey Olegovich Korolenko, Moscow (RU); Andrey Alekseevich Blokhin, Moscow (RU); Oleg Valerevich Fedorov, Moscow (RU); Igor Iurevich Znamenskii, d Drozhzhino (RU); Ivan Vladimirovich Prostov, Moscow (RU); Vladimir Viktorovich Khulagov, Balashikha (RU); Aleksandr Alekseevich Konovalov, mkr Opalikha (RU); Konstantin Aleksandrovich Klubnichkin, Moscow (RU); Nikita Aleksandrovich Vedeneev, Vladimir (RU)

(73) Assignee: YANDEX EUROPE AG, Lucerne (CH)

( * ) Notice: Subject to any disclaimer, the term of this patent is extended or adjusted under 35 U.S.C. 154(b) by 0 days.

(21) Appl. No.: 17/095,818

(22) Filed: Nov. 12, 2020

(65) Prior Publication Data
US 2021/0259138 A1 Aug. 19, 2021

(30) Foreign Application Priority Data
Feb. 14, 2020 (RU) .................................. 2020107010

(51) Int. Cl.
*H05K 7/20* (2006.01)
*H05K 5/02* (2006.01)
(Continued)

(52) U.S. Cl.
CPC .......... *H05K 7/20727* (2013.01); *G06F 1/20* (2013.01); *H05K 5/0221* (2013.01); *H05K 7/1487* (2013.01); *H05K 7/20145* (2013.01)

(58) Field of Classification Search
CPC ............ H05K 7/20727; H05K 5/0221; H05K 7/1487; H05K 7/20145; G06F 1/20; G06F 1/181; G06F 1/183
See application file for complete search history.

(56) References Cited

U.S. PATENT DOCUMENTS 8,335,076 B2 * 12/2012 Zhang ...................... G06F 1/20
361/679.37
10,383,247 B2 * 8/2019 Chen .................... H05K 7/1487
(Continued)

FOREIGN PATENT DOCUMENTS

| CN | 101068454 A | 11/2007 |
|---|---|---|
| CN | 101779178 A | 7/2010 |

(Continued)

OTHER PUBLICATIONS

Shen Yulong; Xu Jipeng; Li Minggang, "Server", Apr. 8, 2015, Inventec Technology Co LTD; Inventec Corp, Entire Document (Translation of CN 104503536). (Year: 2015).*
(Continued)

*Primary Examiner* — Stephen S Sul
(74) *Attorney, Agent, or Firm* — BCF LLP

(57) ABSTRACT

A chassis structure is disclosed. The chassis structure has a chassis with a storage space and a computer node. The storage space is provided for accommodating the computer node. The node has a body removably stored in the storage space. The body has a front and a back portion. The node has a tray frame located in the front portion. The node has a sliding assembly for longitudinally and slideably moving the tray frame between a received and a withdrawn position. The back portion has a first and a second ducting structure,
(Continued)

and is provided for accommodating two components. The first ducting structure disposed over the first component, and the second ducting structure disposed over the second component. The first ducting structure is offset from the second ducting structure for guiding different portions of the fluid flow over the first component and the second component, respectively.

20 Claims, 12 Drawing Sheets

(51) Int. Cl.
  *H05K 7/14* (2006.01)
  *G06F 1/20* (2006.01)

(56) References Cited

U.S. PATENT DOCUMENTS

| | | | |
|---|---|---|---|
| 10,568,229 B1 * | 2/2020 | Ng | H05K 5/0221 |
| 10,568,238 B1 * | 2/2020 | Leung | H05K 7/1489 |
| 2012/0134099 A1 | 5/2012 | Zhang | |
| 2013/0148297 A1 * | 6/2013 | Wei | H05K 7/20727 361/695 |
| 2014/0204525 A1 * | 7/2014 | Pecone | G06F 1/187 361/679.33 |
| 2015/0092340 A1 * | 4/2015 | Jau | G11B 33/128 361/679.39 |
| 2015/0216069 A1 * | 7/2015 | Hori | H05K 7/20581 361/679.48 |
| 2016/0219748 A1 * | 7/2016 | Tsai | H05K 7/1489 |
| 2018/0332730 A1 * | 11/2018 | Konovalov | G11B 33/128 |
| 2021/0127522 A1 * | 4/2021 | Wang | G11B 33/142 |

FOREIGN PATENT DOCUMENTS

| | | | | |
|---|---|---|---|---|
| CN | 104503536 A | * | 4/2015 | H05K 7/1487 |
| CN | 109997422 A | | 7/2019 | |
| CN | 214376157 U | | 10/2021 | |

OTHER PUBLICATIONS

Office Action and Search Report with regard to the counterpart CN Patent Application No. 202011361164.9 dated Apr. 22, 2022.
English Abstract for CN214376157 retrieved on Espacenet on May 20, 2022.
English Abstract for CN 109997422 retrieved on Espacenet on May 20, 2022.
English Abstract for CN 101068454 retrieved on Espacenet on May 20, 2022.
English Abstract for CN101779178 retrieved on Espacenet on May 20, 2022.

* cited by examiner

CHASSIS STRUCTURE

CROSS-REFERENCE

The present application claims priority to Russian Patent Application No. 2020107010, entitled "CHASSIS STRUCTURE," filed on Feb. 14, 2020, the entirety of which is incorporated herein by reference.

FIELD OF TECHNOLOGY

The present technology relates to a chassis structure, and more particularly, to a chassis structure that facilitates cooling of, access to, and removal of electronic components.

BACKGROUND

A server is a central computer that typically serves computers in a network environment and provides necessary functionalities to these network computers such as storage, processing, and exchange of information. Conventional servers may be implemented similarly to conventional personal computers and generally comprise a central processing unit(s) (CPU), a memory(ies) as well as input/output device(s) which are all communicatively coupled together internally via a bus. These internal components of the server or server hardware operate according to inherent specifications and may be influenced by external factors such as temperature, humidity, pressure and the like.

A single server may be composed of a plurality of server racks which accommodate the afore-mentioned server hardware. These server racks are generally implemented in a form of a server cabinet having electronic components arranged in a compact manner in order to minimize the room occupied by the server. The so-arranged server rack may be disposed in a factory, an engine room, a server farm or any other location suitable for physical storage of the server rack. When more than one server rack is required for implementing a server, the more than one server racks are usually disposed one next to the other so as to minimize the room occupied by the server.

Due to the compact stacking or arrangement of the server racks, some of the components of the server may be difficult to access during maintenance or repair of the server. Additionally, the proximity of internal components may have an effect on the performance of the server due to heat generation and its influence on inherent specifications of the internal components.

It should be noted that the server racks generate a considerable amount of heat which may hinder the computation performance of the server. In some cases, server racks are disposed in an air-cooled facility for reducing the ambient air temperature. Nevertheless, continuously air-cooling a facility storing a server is expensive and requires a considerable amount of electrical power.

SUMMARY

Embodiments of the present technology have been developed based on developers' appreciation that while the server racks arranged in a compact manner, the proximity of internal components of server racks may reduce their performance. Embodiments of the present technology have been developed based on developers' appreciation of at least one technical problem associated with the prior art solutions. Therefore, developers have devised a chassis structure for a server rack that allows increasing cooling performance of internal electronic components.

Developers of the present technology have realized that storing server racks in air-cooled facilities may be monetarily expensive and/or require a considerable amount of electrical power. Therefore, in at least some non-limiting embodiments of the present technology, the chassis structure devised by the developers of the present technology may be used in a server rack that is located in a "free-cooling" environment—that is, in an environment where the ambient air is not additionally cooled for reducing its temperature.

In some non-limiting embodiments of the present technology, the chassis structure comprises different types of electronic components that are sequentially longitudinally disposed in the chassis structure and in accordance with their respective operating temperatures. For example, these different types of electronic components can be disposed in the chassis structure such that (i) electronic components of a type having a lowest operating temperature are disposed at the front of the chassis structure, and (ii) electronic components of a type having a highest operating temperature are disposed at the back of the chassis structure; such that the flow of cooling air (which can be ambient air) is from the front of the chassis structure to the back of the chassis structure.

In other non-limiting embodiments of the present technology, the chassis structure comprises a computer node having a front portion and a back portion, and where two electronic components with high operating temperatures are disposed in the back portion of the computer node. These two electronic components are disposed in the back portion such that they are longitudinally offset from one another. This longitudinal offset allows room, longitudinally in between the two electronic components, for accommodating ducting structures which aid in guiding fluid flow through the chassis structure, which increases the cooling performance of the chassis structure. The two electronic components are also disposed in the back portion such that they are laterally offset from one another along the longitudinal axis of the chassis. This lateral offset allows using different portions of the fluid flow for cooling each of the two electronic components, which increases the cooling performance of the chassis structure.

In further non-limiting embodiments of the present technology, the chassis structure comprises a computer node having a plurality of ducting structures. At least some from the plurality of ducting structures are provided with apertures designed to laterally distribute the fluid flow in the chassis. At least some other from the plurality of ducting structures are positioned over respective electronic components for guiding fluid flow over and/or in between the respective electronic components. Furthermore, at least some of the plurality ducting structures, in addition to guiding fluid flow over and/or between respective electronic components, are used as "fluid barriers" for preventing different portions of the fluid flow to mix together in the chassis structure.

In at least some non-limiting embodiments of the present technology, the developers of the present technology have devised a chassis structure that has any combination of the following features:
- being configured to operate in an air-cooled environment and/or a "free-cooling" environment;
- comprising different types of electronic components that are sequentially longitudinally disposed in the chassis structure and in accordance with their respective operating temperatures;

comprising at least one computer node having a front portion and a back portion, and where two electronic components with high operating temperatures are disposed in the back portion of the at least one computer node;

having the two high-temperature electronic components disposed in the back portion such that they are longitudinally offset from one another in the chassis structure;

having the two high-temperature electronic components disposed in the back portion such that they are laterally offset from one another along the longitudinal axis of the chassis structure;

having the at least one computer node with a plurality of ducting structures;

having some ducting structures provided with apertures configured to laterally distribute the fluid flow in the at least one computer node;

having some ducting structures positioned over respective electronic components for guiding fluid flow over and/or in between the respective electronic components in the at least one computer node;

having some ducting structures that are used as "fluid barriers" for preventing different portions of the fluid flow to mix together in the at least one computer node;

having some ducting structure(s) provided with vertically extending wall(s) for aiding in preventing different portions of the fluid flow to mix together in the at least one computer node;

having some ducting structures being integrally formed;

having a chassis with a back wall that has apertures and respective fans removably attached to the back wall for generating fluid flow in the chassis;

having a motherboard suitable for operation under a first voltage and under a second voltage;

having a motherboard configured for coupling external storage devices; and having network ports that are facing forward from the chassis structure.

In a first broad aspect of the present technology, there is provided a chassis structure. The chassis structured comprises a chassis. The chassis includes: (i) a first bottom panel, (ii) a first sidewall and a second sidewall longitudinally extending in the chassis and located on respective sides of the first bottom panel, (iii) a partition wall longitudinally extending in the chassis, (iv) a back wall extending between the first sidewall and the second sidewall at a back of the chassis and where the back wall has apertures for allowing fluid flow between inside of the chassis and outside of the chassis. The first bottom panel, the first sidewall, the second sidewall, the partition wall, and the back wall define two storage spaces in the chassis. The chassis structure also comprises a computer node, and where a given one of the two storage spaces accommodates the computer node. The computer node includes: (i) a body having a second bottom panel, a third sidewall and a fourth sidewall longitudinally extending in the body and located on respective sides of the second bottom panel, and (ii) a tray frame located in the front portion of the body and including a top access opening. The body is removably stored in the given one of the two storage spaces. The body has a front portion and a back portion. The front portion and the back portion are disposed longitudinally sequentially in the body from a front end of the body to a back end of the body. The tray frame for accommodating a first electronic component. The body also includes a sliding assembly including (i) a side of the tray frame and (ii) a corresponding one of the third sidewall and the fourth sidewall. The sliding assembly is configured for longitudinally and slideably moving the tray frame between a received position and a withdrawn position. The back portion of the body includes a first ducting structure and a second ducting structure. The back portion is for accommodating a second electronic component and an other second electronic component. The first ducting structure disposed over the second electronic component, and where the first ducting structure is for guiding the fluid flow over the second electronic component for cooling the second electronic component during operation. The second ducting structure disposed over the other second electronic component, and where the second ducting structure is for guiding the fluid flow over the other second electronic component for cooling the second electronic component during operation. The first ducting structure is offset from the second ducting structure for guiding different portions of the fluid flow over the second electronic component and the other second electronic component, respectively.

In some embodiments of the chassis structure, the first electronic component has a first operation temperature and the second electronic component has a second operation temperature. The second operation temperature is above the first operation temperature.

In some embodiments of the chassis structure, the first ducting structure being offset from the second ducting structure includes the first ducting structure being longitudinally offset from the second ducting structure in the body.

In some embodiments of the chassis structure, the first ducting structure being offset from the second ducting structure includes the first ducting structure being laterally offset from the second ducting structure along a longitudinal axis of the body.

In some embodiments of the chassis structure, the first ducting structure guides a first portion of the fluid flow over the second electronic component and the second ducting structure guides a second portion of the fluid flow over the other second electronic component. The back portion further includes a third ducting structure. The third ducting structure is disposed in the back portion of the body so as to prevent fluid communication between the first portion of the fluid flow and the second portion of the fluid flow.

In some embodiments of the chassis structure, the third ducting structure has a vertically extending wall. The vertically extending wall is a fluid barrier for preventing fluid communication between the first portion of the fluid flow and the second portion of the fluid flow.

In some embodiments of the chassis structure, the third ducting structure is disposed longitudinally in between the second electronic component and the other second electronic component.

In some embodiments of the chassis structure, the first ducting structure, the second ducting structure and the third ducting structure are integrally formed.

In some embodiments of the chassis structure, the chassis structure is configured to be accommodated in a server rack.

In some embodiments of the chassis structure, at least one of the chassis structure and the server rack further includes a fan. The fan is for generating the fluid flow (i) from a front end of the chassis, (ii) towards a back end of the chassis and (iii) towards the outside of the chassis.

In some embodiments of the chassis structure, the fan is longitudinally aligned with the apertures and is removably attached to the back wall.

In some embodiments of the chassis structure, the back portion of the body further has a motherboard, the second electronic component being electrically coupled to and located on the motherboard.

In some embodiments of the chassis structure, the motherboard is configured for electrically coupling external storage devices.

In some embodiments of the chassis structure, the motherboard includes a DC converter for operating under at least one of a first voltage and a second voltage.

In some embodiments of the chassis structure, the computer node includes a network port. The network port is for acquiring processable tasks to be processed by the second electronic component. The network port is located on a given side of the tray frame and facing the front of the chassis structure.

In some embodiments of the chassis structure, the withdrawn position includes a first withdrawn position and a second withdrawn position, and where the first electronic component is accessible through the top access opening in the first withdrawn position and the second withdrawn position.

In some embodiments of the chassis structure, the tray frame is further for accommodating a fourth electronic component disposed longitudinally sequentially in the tray frame after the first electronic component.

In some embodiments of the chassis structure, the fourth electronic component is accessible through the top access opening only in the second withdrawn position.

In some embodiments of the chassis structure, the tray frame further includes a latching assembly for pivotably moving the fourth electronic component from a stored position to an easy-access position. The fourth electronic component in the stored position is parallel to the top access opening. The fourth electronic component in the easy-access position is at an angle with the top access opening.

In some embodiments of the chassis structure, a fourth ducting structure is located in the tray frame and disposed over the fourth electronic component. The fourth ducting structure includes a plurality of back-facing apertures for distributing the fluid flow.

Implementations of the present technology each have at least one of the above-mentioned object and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

These and other features, aspects and advantages of the present technology will become better understood with regard to the following description, appended claims and accompanying drawings where:

DETAILED DESCRIPTION

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Chassis Structure

Figure 12:
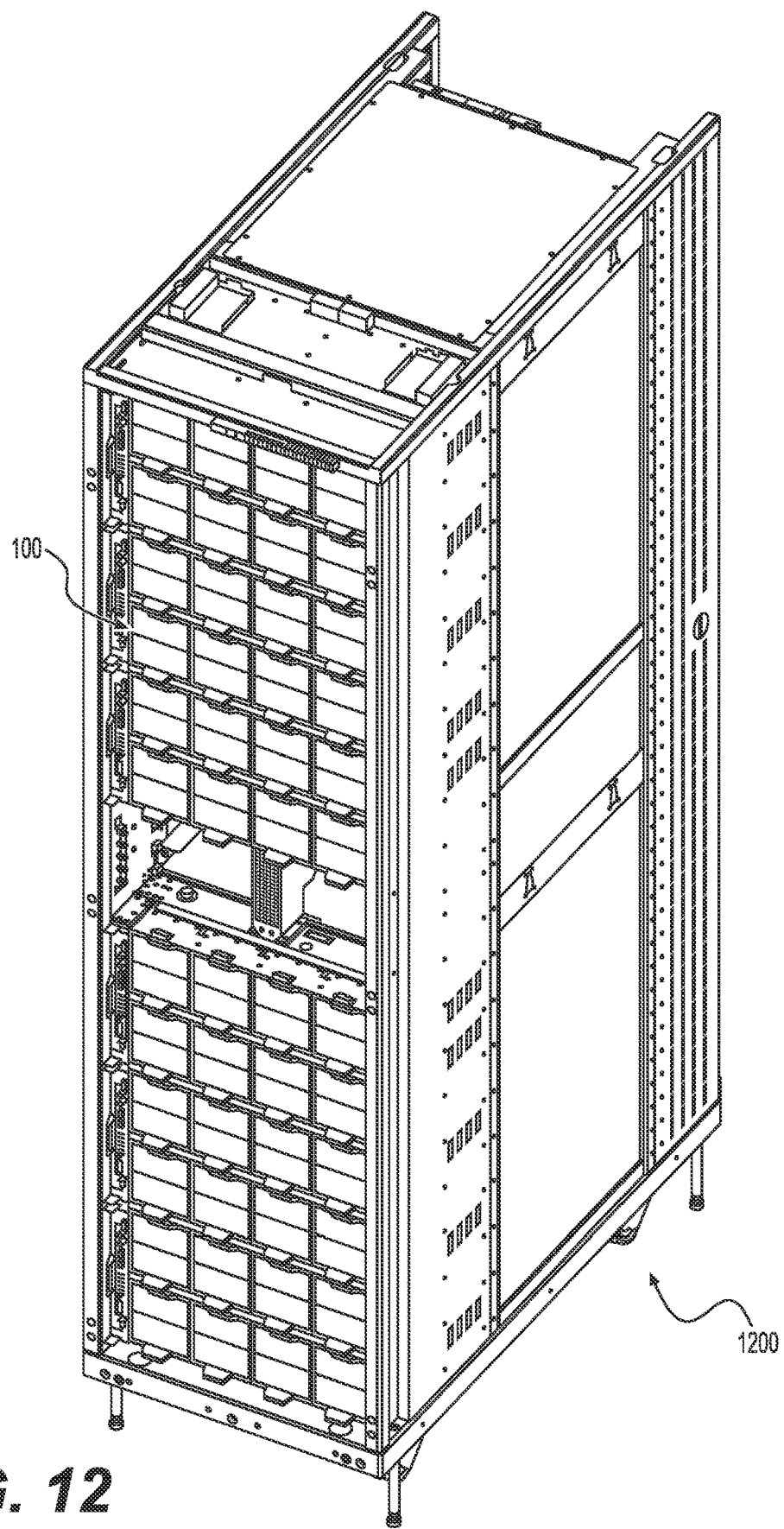
FIG. 12 is a front left perspective view of a server rack accommodating the chassis structure of FIG. 1.

With reference to FIG. 12, there is depicted a server rack 1200 accommodating a chassis structure 100 amongst a plurality of chassis structures (not numbered). Hence, it can be said that the chassis structure 100 is configured to be accommodated in the server rack 1200. Broadly speaking, one or more chassis structures of the server rack 1200 are configured to process processable requests and/or tasks for an external client. For example, data indicative of a given processable request may be acquired by one or more electronic components of the chassis structure 100 (and/or by electronic components of other chassis structures of the server rack 1200). This data may be then processed and/or stored by the one or more electronic components of the chassis structure 100. How the chassis structure 100 is implemented in at least some embodiments of the present technology will now be described in greater detail with reference to FIG. 1.

Figure 1:
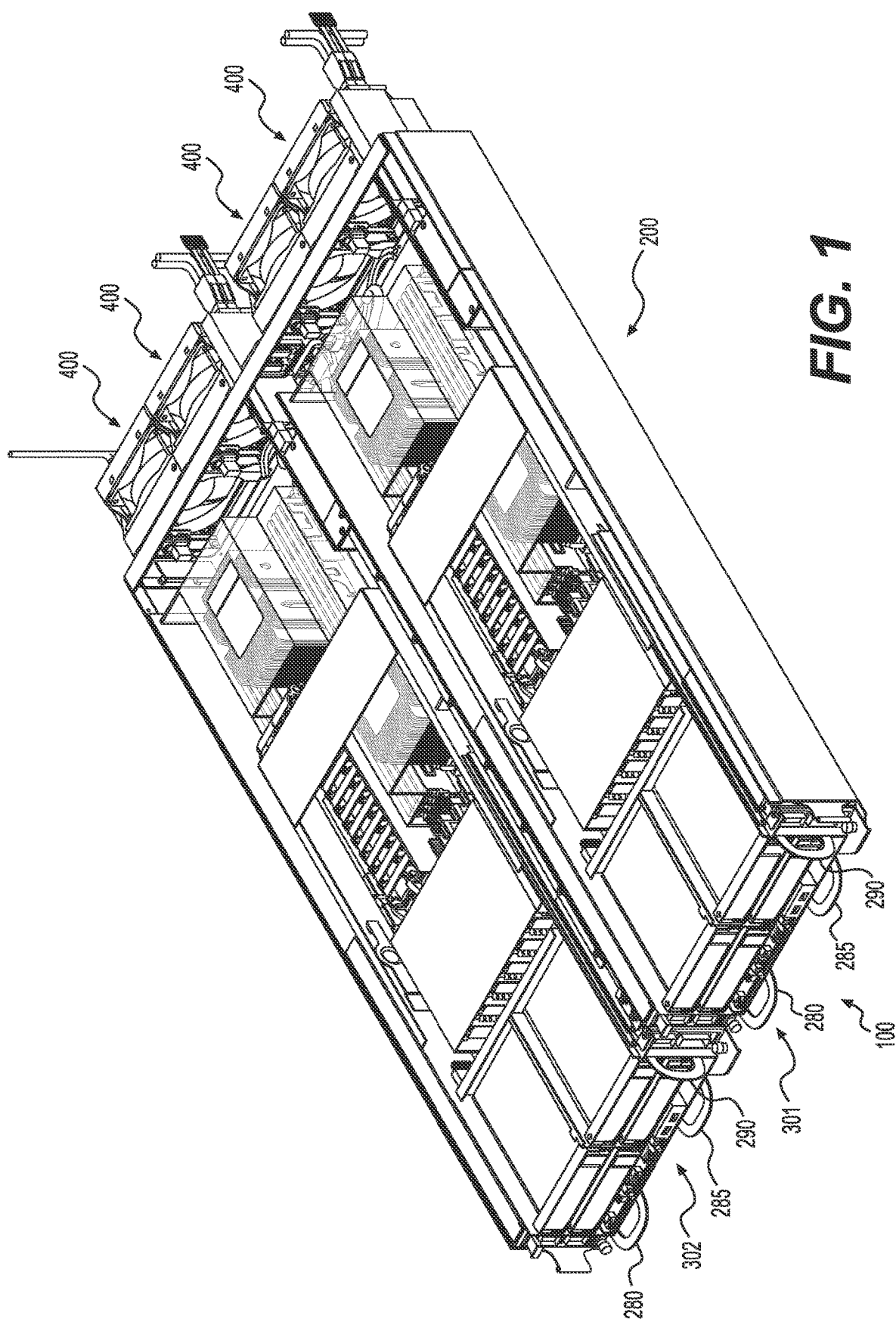
FIG. 1 is a front left perspective view of a chassis structure with first and second computer nodes being in a received position, and accommodating a plurality of electronic components.

As depicted in FIG. 1, the chassis structure 100 comprises a chassis 200 and two computer nodes, namely a first computer node 301 and a second computer node 302. The chassis structure 100 also comprises fans 400 at the back thereof.

However, in at least some embodiments, the fans 400 may be omitted from the chassis structure 100. For example, it is contemplated that the fans 400 may alternatively be provided on a back portion of the server rack 1200. It should be noted that in at least some embodiments of the present technology, the first computer node 301 may be identical to the second computer node 302.

Also, the chassis structure 100 comprises a plurality of handles (not numbered), including chassis handles 285, computer node handles 280 and tray handles 290. As it will become apparent from the description herein further below, the plurality of handles may allow an operator to perform maintenance and/or replacement of at least some components of the chassis structure with greater efficiency.

Chassis

How the chassis 200 of the chassis structure 100 may be implemented in at least some embodiments of the present technology will now be described with reference to FIG. 2.

Figure 2:
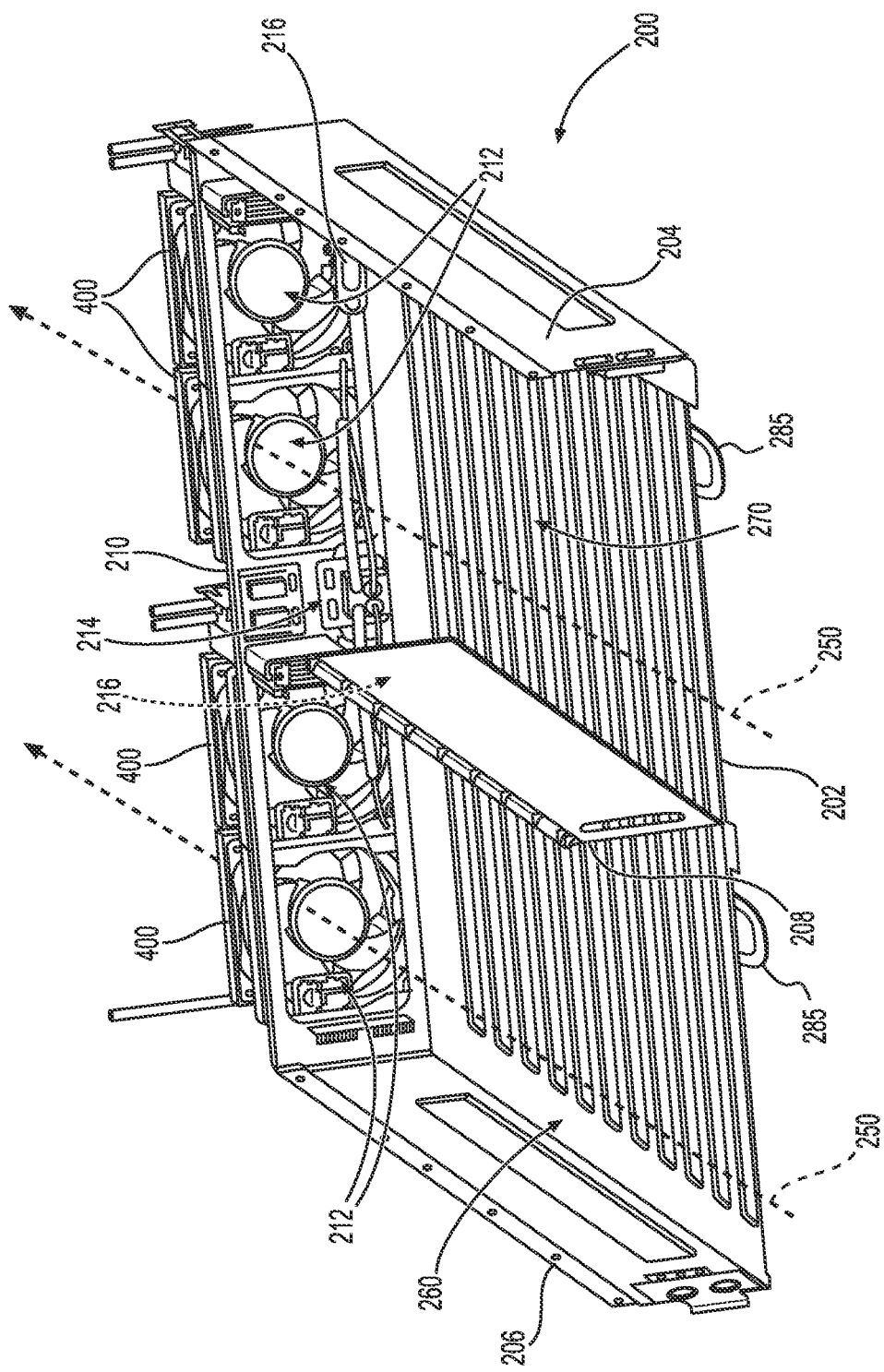
FIG. 2 is a front left perspective view of a chassis of the chassis structure of FIG. 1, with fans, and with the first and second computer nodes being removed.

As depicted in FIG. 2, the chassis 200 comprises a first bottom panel 202, a first sidewall 204, a second sidewall 206, a partition wall 208, and a back wall 210. The first sidewall 204 and the second sidewall longitudinally extend in the chassis 200 and are located on respective sides of the first bottom panel 202. The partition wall 208 also longitudinally extends in the chassis 200 and is located between the first sidewall 204 and the second sidewall 206. The partitional wall 208 is substantially parallel to the first sidewall 204 and the second sidewall 206. The back wall 210 laterally extends between and connects to the first sidewall 204 and the second sidewall 206 at the back of the chassis 200.

The first sidewall 204, the second sidewall 206, the partition wall 208 and the back wall 210 are attached to the first bottom panel 202 of the chassis 200 using any suitable attachment means, such as bolts and/or screws, for example. Alternatively, the first sidewall 204, the second sidewall 206, the partition wall 208 and the back wall 210 may be integrally formed with the first bottom panel 202 for providing the chassis 200.

The back wall 210 is also configured to accommodate inter alia a power connector 214, motherboard connectors 216, and other connectors (not numbered) which will be discussed in greater details herein further below. The back wall 210 is provided with apertures 212 for, generally speaking, allowing fluid communication between inside of the chassis 200 and the outside of the chassis 200 through the back wall 210.

It should be noted that in the non-limiting embodiment depicted in FIG. 2, the fans 400 are removably attached to the back wall 210 on the outside of the chassis 200. As illustrated, when the fans 400 are removably attached to the back wall 210, the fans 400 are longitudinally aligned with respective apertures 212. As it will be described in greater details herein further below, having the fans 400 so positioned with respect to the apertures 212 allows the fans 400 to produce fluid flow(s) in accordance with direction 250 that is, from the inside of the chassis 200, through the back wall 210, towards the outside of the chassis 200.

It should be noted that the first sidewall 204, the second sidewall 206, the partition wall 208 and the back wall 210 and the first bottom panel 202 define two storage spaces in the chassis 200, namely a first storage space 270 and a second storage space 260.

The first storage space 270 is defined by the first bottom panel 202, by the first sidewall 204 on the left, by the partition wall 208 on the right, and by the back wall 210 at the back. Similarly, the second storage space 260 is defined by the first bottom panel 202, by the second sidewall 206 on the right, by the partition wall 208 on the left, and by the back wall 210 at the back. The two storage spaces 270 and 260 are disposed on respective sides of the partition wall 208. In a specific non-limiting embodiment of the present technology, the two storage spaces 270 and 260 may be substantially identical to each other.

The chassis handles 285 are provided on the first bottom panel 202 and extend forwardly away from the chassis 200.

The first storage space 270 of the chassis 200 is configured to accommodate the first computer node 301 (see FIG. 1), and the second storage space 260 of the chassis 200 is configured to accommodate the second computer node 302 (see FIG. 1) or vice versa. It can be said that a given one of the two storage space 270 and 260 accommodates a respective computer node from the computer nodes 301 and 302.

Computer Node

How the second computer node 302 is implemented will now be described with reference to FIG. 3. However, it should be noted that the first computer node 301 may be implemented in a similar manner to the second computer node 302, without departing from the scope of the present technology.

Figure 3:
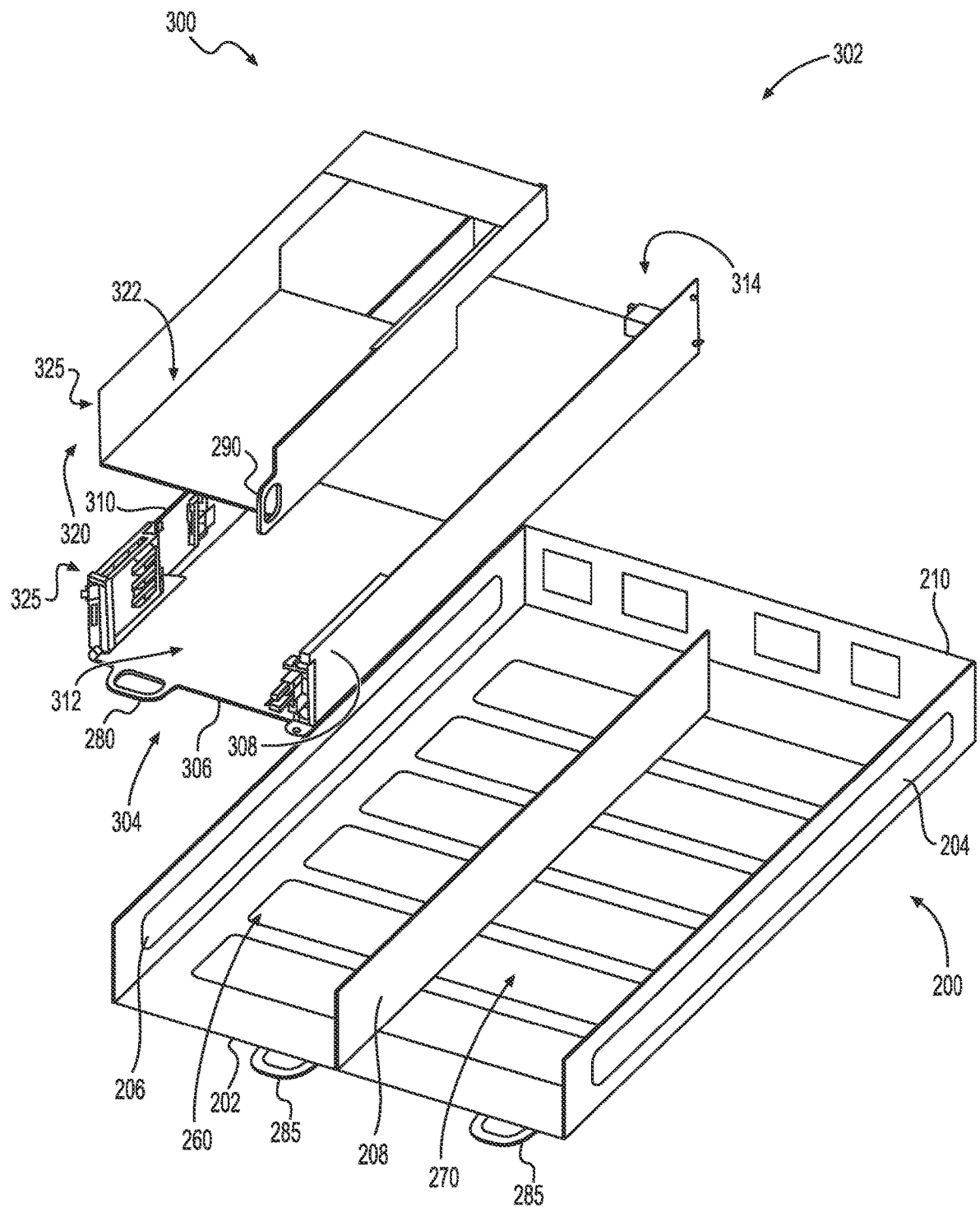
FIG. 3 is a front left exploded view of the chassis and the second computer node of FIG. 1, with electronic components of the second computer node being removed, with the fans being removed, and with the first computer node being removed.

In FIG. 3, there is illustrated a representation 300 of the chassis 200 and of the second computer node 302 in an exploded view. It is noted that the first computer node 301 and the internal components of the chassis structure 100 have been omitted from the FIG. 3 illustration for sake of simplicity. Also, the representation 300 of the chassis 200 and of the second computer node 302 is a simplified representation of the chassis 200 and of the second computer node 302 for sake of simplicity only.

As seen, the second computer node 302 comprises a body 304, a tray frame 320, and a sliding assembly 325, which will now be described in turn.

The body 304 includes a second bottom panel 306, a third sidewall 308 and a fourth sidewall 310. The third sidewall 308 and the fourth sidewall 310 longitudinally extend in the body 304 and are located on respective sides of the second bottom panel 306. The computer node handle 280 is provided on the second bottom panel 306 and extends forwardly away from the body 304. The third sidewall 308 and the fourth sidewall 310 are attached to the second bottom panel 306, but alternatively, may be integrally formed with the second bottom panel 306.

It should be noted that a given computer node is configured to be removed from a respective storage space, which may be desirable for a variety of reasons. For example, the given computer node may be removed from the respective storage space by an operator for maintenance and/or replacement purposes. Thus, it can be said that the body 304 is configured to be removably stored in the second storage space 260. Hence, it can be said that the second computer node 302 may be removably stored in the second storage space 260.

Also, the body 304 has a front portion 312 thereof and a back portion 314 thereof. The front portion 312 of the body 304 and the back portion 314 of the body 304 are disposed longitudinally sequentially in the body 304 from the front end thereof to a back end thereof.

The front portion 312 of the body 304 is configured to accommodate the tray frame 320. The tray frame 320 has two sides (not numbered) and includes a top access opening 322. The tray handle 290 is provided on one of the two sides of the tray frame 320 and extends forwardly away from the tray frame 320. The tray frame 320 is slideably movable from a received position to at least one withdrawn position such that when the tray frame 320 is the received position, the tray frame 320 is located in the front portion 312 of the body 304.

It should be noted that the tray frame 320 is configured to slideably move between the received position and the at least one withdrawn position due to the sliding assembly 325 of the second computer node 302. The sliding assembly 325 is located in the front portion of the body 304. The sliding assembly 325 includes a given side of the tray frame 320 and the corresponding fourth sidewall 310 of the body 304. However, the sliding assembly 325 may include the other side of the tray frame 320 and the corresponding third sidewall 308. In some embodiments, however, the second computer node 302 may have two slide assemblies, one on each side of the tray frame 320, and implemented similarly to how the sliding assembly 325 is implemented.

In one embodiment, the given side of the tray frame 320 may be nested in the corresponding sidewall of the body 304 for providing the sliding assembly 325. In other words, the corresponding sidewall of the body may be configured for receiving the given side of the tray frame 320 in a nested manner for providing a sliding assembly. In a further embodiment, the corresponding sidewall of the body may be adapted for receiving the given side of the tray frame 320 in a nested manner for providing a sliding assembly. In another embodiment, the given side of the tray frame 320 and the corresponding sidewall of the body 304 may have suitable railing structures for providing the sliding assembly 325.

It should be noted that the sliding assembly 325 may be implemented in a variety of ways for a specific application of the present technology. However, the sliding assembly 325 is configured for longitudinally and slideably move a respective tray frame of a given computer node between (i) a received position (see FIG. 1), (ii) a first withdrawn position (see FIG. 9), and (iii) a second withdrawn position (see FIG. 10). As it will become apparent from the description herein further below, the purpose of slideably moving the given tray frame is to provide access or additional access to at least some electronic components of the respective computer node, without requiring the removal of the respective computer node from the chassis 200.

Figure 4:
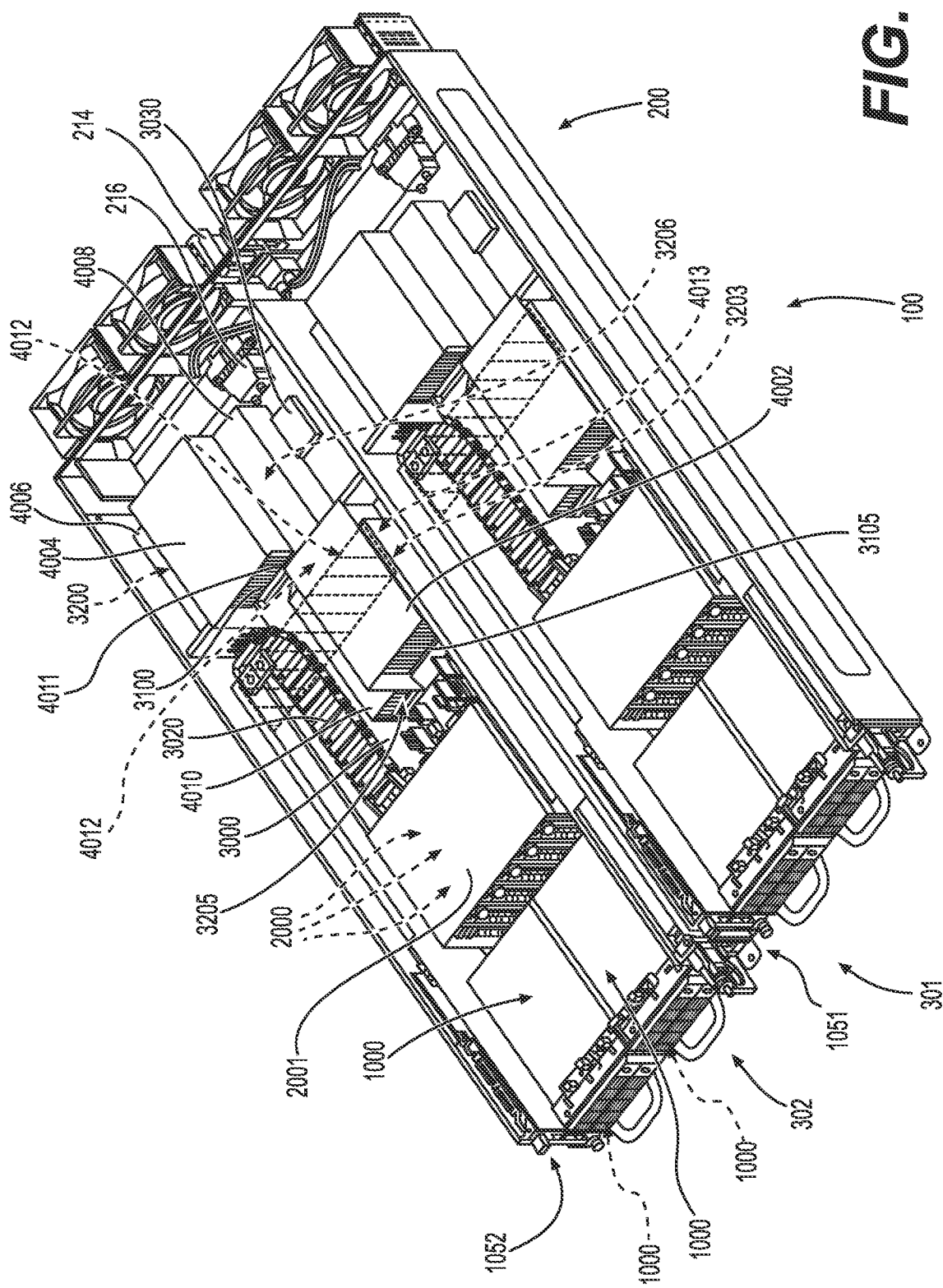
FIG. 4 is an other front left perspective view of the chassis structure of FIG. 1.

It should also be noted that the second computer node 302 also includes a chain structure 3020 (see FIG. 4). The chain structure 3020 is attached (i) to the tray frame 320 at a back of the tray frame 320 at one end thereof, and (ii) to the second bottom panel 306 of the body 304 at the other end thereof. Generally speaking, the chain structure 3020 is provided for avoiding the risk of withdrawing the tray frame 320 from the body 304 to a point where it becomes disconnected therefrom. It can be said the chain structure 3020 can limit the position of the tray frame 320 and cooperates with the sliding assembly 325 to prevent the tray frame 320 from inadvertently falling out or disconnecting from the body 304.

It is contemplated that in at least some embodiments of the present technology, the chain structure 3020 may be pivotably attached to the tray frame 320 at the back of the tray frame 320 at one end thereof and pivotably attached to the second bottom panel 306 of the body 304 at the other end thereof.

Additionally to connecting the tray frame 320 with the body 304, the chain structure 3020 may define a hollow passage (not numbered) for accommodating cabling for electrically coupling at least some electronic components in the tray frame 320 to at least some other electronic components in the body 304.

Electronic Components

As mentioned above, the second computer node 302 is configured to accommodate electronic components for data processing and/or storage purposes. It should be noted that at least some of the electronic components are accommodated in the tray frame 320, while other electronic components are accommodated in the body 304. Which ones of electronic components of the second computer node 302 are accommodated in the tray frame 320 (e.g., which is accommodated in the front portion 312 of the body 304) and which electronic components of the second computer node 302 are accommodated in the body 304 (e.g., the back portion 314 of the body 304) will now be described with reference to both FIGS. 4 and 5.

Figure 5:
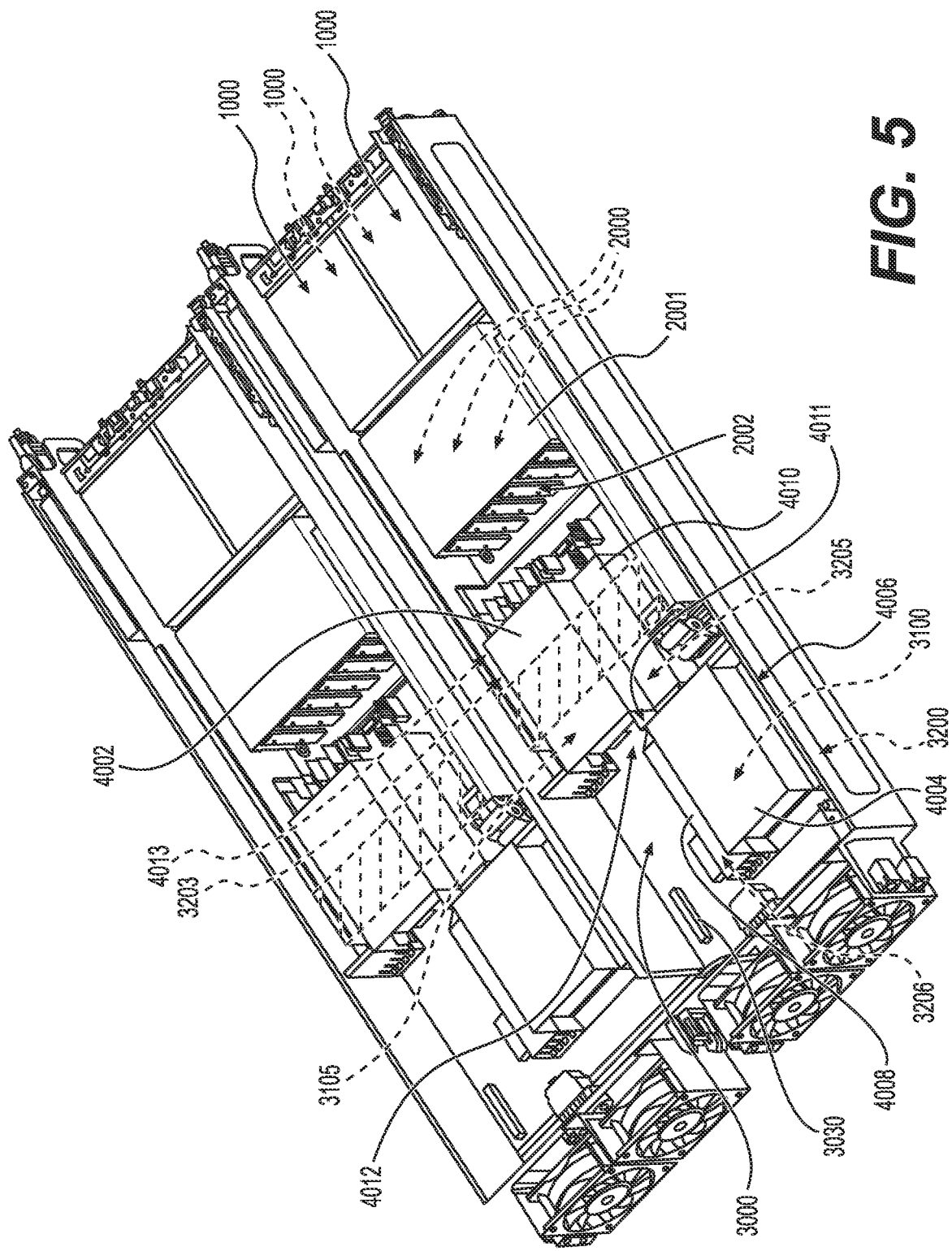
FIG. 5 is a back right perspective view of the chassis structure of FIG. 1.

As depicted in FIGS. 4 and 5, the second computer node 302 accommodates in the tray frame 320 first electronic components 1000, and fourth electronic components 2000. Generally speaking, the first electronic components 1000 and the fourth electronic components 2000 can be distinct types of storage media.

For example, a given first electronic component 1000 may be a hard disk drive (HDD). A given first electronic component 1000 may have an operating temperature of 50 degrees Celsius (as an example). Alternatively, the given first electronic component 1000 may be operating at about 50 degrees Celsius and, as such, the operating temperature thereof may be between 45 degrees Celsius and 55 degrees Celsius.

In another example, a given fourth electronic component 2000 may be a solid-state drive (SSD). Alternatively, the given fourth electronic component 2000 may be a non-volatile memory storage medium (NVME). The given fourth electronic component 2000 may have an operating temperature of 70 degrees Celsius (as an example). Alternatively, the given fourth electronic component 2000 may be operating at about 70 degrees Celsius and, as such, the operating temperature thereof may be between 65 degrees Celsius and 75 degrees Celsius.

The fourth electronic components 2000 are covered by a ducting structure 2001 having a plurality of back-facing apertures 2002. It is contemplated that the apertures from the plurality of back-facing apertures 2002 may be laterally equidistantly located from each other. It is also contemplated that a given back-facing aperture may extend vertically and may have a slit-like profile. As it will be described herein further below, the ducting structure 2001 having the plurality of back-facing apertures 2002 allows distributing the fluid flow over the fourth electronic components 2000 for a more efficient cooling of the fourth electronic components 2000 during operation, and/or laterally distributing the fluid flow in the second computer node 302.

As it will also be described in greater details herein further below, provision of the first electronic components 1000 at the front of the tray frame 320 and of the fourth electronic components 2000 at the back of the tray frame 320 (and therefore longitudinally behind the first electronic components 1000) may allow a more efficient cooling of the first electronic components 1000 and of the fourth electronic components 2000 during operation.

The second computer node 302 also accommodates in the back portion 314 of the body 304 a motherboard 3000. The motherboard 3000 is electrically coupled to the first electronic components 1000 and to the fourth electronic components 2000 via cabling (not depicted) as known in the art. The motherboard 3000 is also electrically coupled to the power connector 214 via the motherboard connector 216. For example, the power connector 214 may be electrically coupled to a power bus of the server rack 1200 (see FIG. 12) and in turn to a power source, and may provide electrical power to the motherboard 3000, and to other electronic components of the second computer node 302.

In at least some embodiments of the present technology, the motherboard 3000 may be configured for electrically coupling additional external storage devices (not depicted). For example, in certain implementations, in order to process and/or store processable requests from a client, the second computer node 302 may require additional storage media to the first electronic components 1000 and the fourth electronic components 2000. In such a case, the motherboard 3000 configured for electrically coupling external storage devices may increase the storage media capacity of the second computer node 302.

Also, the motherboard 3000 includes a DC converter 3030. Broadly speaking, the DC converter 3030 may be configured to convert power from a first voltage of 12 volts to a second voltage of 48 volts, and vice versa. Developers of the present technology have realized that providing the motherboard 3000 with the DC converter 3030 may allow the motherboard 3000 to operate under different voltage specifications, and therefore makes the motherboard 3000 more versatile for use with a variety of power supplies and server rack systems. For example, if the power supply operates at 12 volts, the motherboard 3000 may not need to employ the DC converter 3030. However, if the power supply operates at 48 volts, the motherboard may employ the DC converter 3030 for converting the current to 12 volts. Hence, it is possible to have a single motherboard being configured to operate under 12 volts, while the DC converter 3030 can be used when it is desirable to use the single motherboard when power is supplied under 48 volts. This can result in a technical advantage of not having to produce multiple motherboards for different implementations under different voltages.

The second computer node 302 also accommodates in the back portion 314 of the body 304 a plurality of second electronic components (not numbered), including a second front electronic component 3105, and a second back electronic component 3100. Generally speaking, the plurality of second electronic components are a type of processing unit (e.g., CPU).

For example, the second front electronic component 3105 and the second back electronic component 3100 may have an operating temperature of 95 degrees Celsius (as an example). Alternatively, the second front electronic component 3105 and the second back electronic component 3100 may be operating at about 95 degrees Celsius and, as such, the operating temperature of the second front electronic component 3105 and the second back electronic component 3100 may be between 90 degrees Celsius and 100 degrees Celsius.

The second front electronic component 3105 and the second back electronic component 3100 are located on the motherboard 3000 and are electrically coupled therewith. It should be noted that the second front electronic component 3105 and the second back electronic component 3100 are positioned on the motherboard 3000 in the back portion 314 of the body 304 such that they are offset from one another. The second front electronic component 3105 and the second back electronic component 3100 are longitudinally offset in the second computer module 302. The second front electronic component 3105 and the second back electronic component 3100 are also laterally offset from one another along a longitudinal axis of the second computer module 302. It is contemplated that the second front electronic component 3105 and the second back electronic component 3100 are arranged in a staggered formation in the second computer node 302.

As it will become apparent from the description herein further below, providing the second front electronic component 3105 and the second back electronic component 3100 in the back portion 314 of the body 304 such that they are offset from one another may allow a more efficient cooling of the second front electronic component 3105 and the second back electronic component 3100 during operation.

It should be noted that the second front electronic component 3105 and the second back electronic component 3100 are covered by a ducting structure 4002 and a ducting structure 4004, respectively. As it will be described herein further below, the ducting structure 4002 and the ducting structure 4004 allow guiding the fluid flow over the second front electronic component 3105 and the second back electronic component 3100, respectively, for a more efficient cooling of the second front electronic component 3105 and the second back electronic component 3100 during operation.

The second computer node 302 also accommodates, in the back portion 314 of the body 304, third electronic components 3200, 3206, 3205, and 3203. Generally speaking, the third electronic components 3200, 3206, 3205, and 3203 are a type of computer memory device.

For example, a given third electronic component may be a random-access memory (RAM). The given third electronic component may have an operating temperature of 75 degrees Celsius (as an example). Alternatively, the given third electronic component may be operating at about 75 degrees Celsius and, as such, the operating temperature thereof may be between 70 degrees Celsius and 80 degrees Celsius.

The third electronic components 3200, 3206, 3205, and 3203 are located on the motherboard 3000 and are electrically coupled therewith. As seen, the third electronic components 3205 and 3203 longitudinally extend on each side of the second front electronic component 3105, while the third electronic components 3200 and 3206 longitudinally extend on each side of the second back electronic component 3100.

It should be noted that the third electronic components 3200, 3206, 3205, and 3203 are covered by ducting structures 4006, 4008, 4010, and 4013, respectively. As it will be described herein further below, the ducting structures 4006, 4008, 4010, and 4013 allow guiding the fluid flow over the third electronic components 3200, 3206, 3205, and 3203, respectively, for a more efficient cooling of the third electronic components 3200, 3206, 3205, and 3203 during operation.

Also, it should be noted that the ducting structure 4010 and the ducting structure 4008 are connected by a channel-like ducting structure 4012, which allows guiding the fluid flow from the ducting structure 4010 to the ducting structure 4008. As it will become apparent from the description herein further below, the channel-like ducting structure 4012 also has a vertically extending barrier wall 4011 and may allow preventing fluid communication between a portion of the fluid flow guided over the front second electrical component 3105 and a portion of the fluid flow guided over the second back electronic component 3100.

Figure 6:
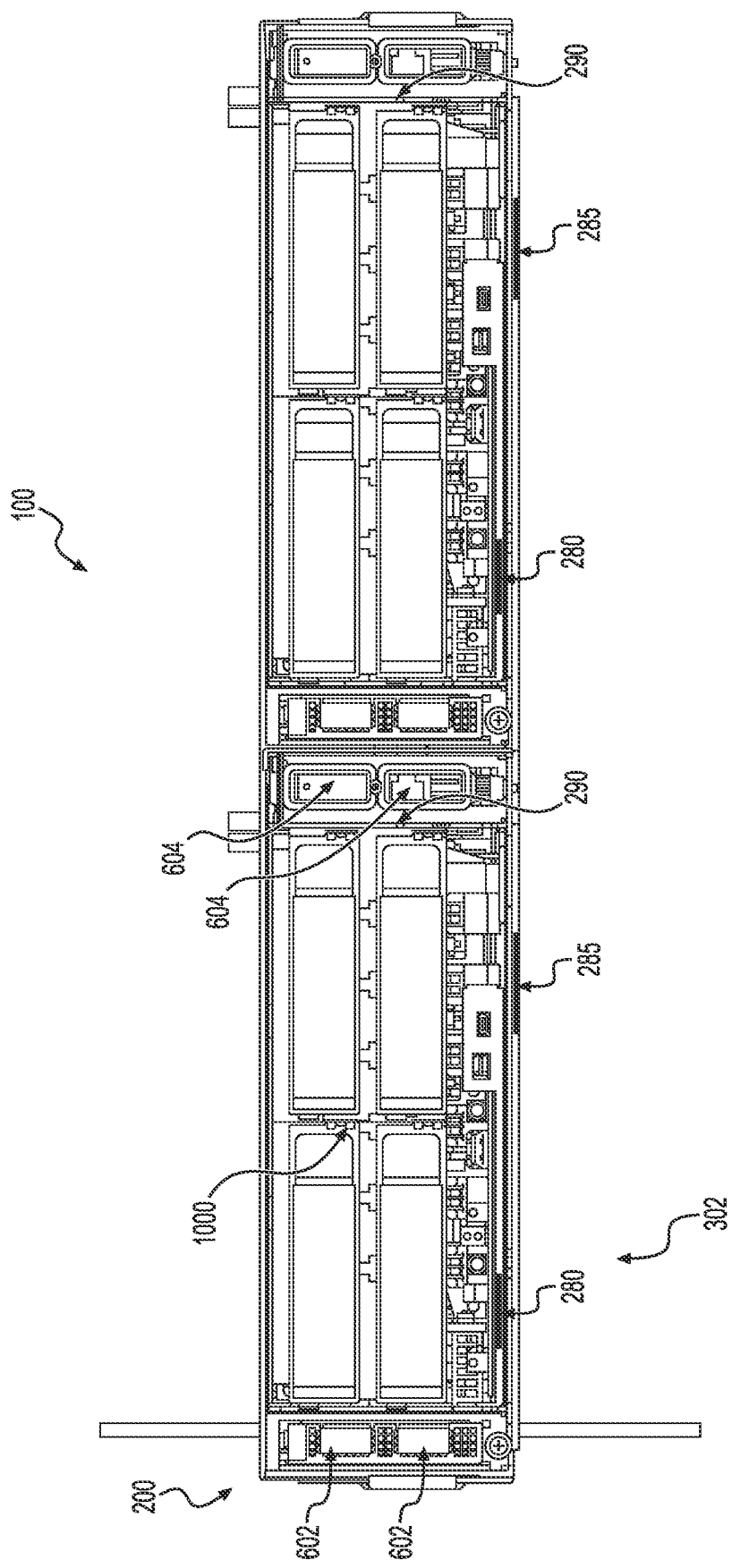
FIG. 6 is a front plane view of the chassis structure of FIG. 1.

With reference to FIG. 6, there is depicted a front plane view of the chassis structure 100. It should be noted that the second computer node 302 also comprises network ports 602 and network ports 604 at the front of the second computer node 302. Broadly speaking, the network ports 602 and 604 are configured to acquire processable tasks or request to be processed by at least some electronic components of the second computer node 302.

The network ports 602 are located on one side of the tray frame 320 (on the outside thereof), while the network ports 604 are located on the other side of the tray frame 320 (on the outside thereof). It should also be noted that the network ports 602 and 604 are disposed such that they are facing the front of the chassis structure 100. As it will become apparent from the description herein further below, the network ports 602 and 604 being disposed such that they are facing the front of the chassis structure 100 may allow operators to slideably move the tray frame 320 between the received position and the at least one withdrawn position, without disconnecting cabling from the network ports 602 and 604.

Operation

As previously alluded to, the chassis structure 100 (see FIG. 12) is configured for installment in the server rack 1200. In order to be inserted and installed in the server rack 1200, the first and second sidewalls 204 and 206 (see FIG. 2) of the chassis 200 can cooperate with inner walls (not numbered) of the server rack 1200 for snuggly inserting the chassis structure 100 into the server rack 1200. The operator can snuggly insert the chassis structure 100 into the server rack 1200 and can install it by pushing on chassis handles 285 provided at the front of the first bottom panel 202. By pushing on the chassis handles 285, the operator connects the power connector 214 to a power bus of the server rack 1200 and a management-port connector (not numbered) to main management busses of the server rack 1200. Once the chassis structure 100 is snuggly inserted into the server rack 1200 and is so-installed, the chassis structure 100 cooperates with the inner walls of the server rack 1200 for locking the chassis structure 100 in place. It is contemplated that cooperation between the chassis structure 100 and the inner walls of the server rack 1200 may be enabled by one or more locking assemblies.

For example, the operator can remove the chassis structure 100 from the server rack 1200 by actuating the locking assemblies and thereby stopping the cooperation between the chassis structure 100 and the inner walls of the server rack 1200. The operator can pull (under-hand pull) on the chassis handles 285 for removing the chassis structure 100 from the server rack 1200.

How the operator may operate a given computer node, such as the computer node 302 will now be described. However, it should be understood that the operator may operate the first computer node 301 in a similar manner to how the operator operates the second computer node 302.

In order to be inserted into the chassis 200 (e.g., into the second storage space 260), the partition wall 208 and second sidewall 206 (see FIG. 2) of the chassis 200 can cooperate with the third and fourth sidewalls 308 and 310, respectively.

The operator can snuggly insert the body 304 of the second computer node 302 into the second storage space 260 by pushing on computer node handle 280 provided at the front of the second bottom panel 306. Once the body 304 is snuggly inserted into the second storage space 260, the body 304 cooperates with the partition wall 208 and second sidewall 206 for locking the body 304 in place. It is contemplated that cooperation between the body 304 and the partition wall 208 and second sidewall 206 may be enabled by one or more locking assemblies.

How the operator may operate a given tray frame will now be described. Examples will be provided for a tray frame of the first computer node 301. It should be noted that components of the first computer node 301 that are identical to components of the second computer node 302 will be referred to by corresponding numerals for sake of simplicity. However, it should be understood that the operator may operate the tray frame 320 of the second computer node 302 in a similar manner to how the operator operates the tray frame 320 of the first computer node 301.

It should be noted that when the tray frame 320 is in the received position (see FIG. 1) the first electronic components 1000 are accessible from the front of the tray frame 320, however, the fourth electronic components 2000 are inaccessible. As mentioned above, the tray frame 320 has the top access opening 322 for providing access to the first electronic components 1000 when the tray frame 320 is in the first withdrawn position, such as depicted in FIG. 9.

When the tray frame 320 is in the first withdrawn position, the respective first electronic components 100 can be installed into or removed from the given tray frame 320 individually through the top access opening 322 and/or from the front of the tray frame 320. However, when the tray frame 320 is in the second withdrawn position as depicted in FIG. 10, the top access opening 322 provides access to both the first electronic components 1000 and the second electronic components.

Developers of the present technology have realised that having the tray frame 320 slideable movable from the received position to at least one withdrawn position may allow providing access to at least some of the first electronic components 1000 and the fourth electronic components 2000 through the top access opening 322, and without removing the first computer node 301 from the chassis 100.

Figure 9:
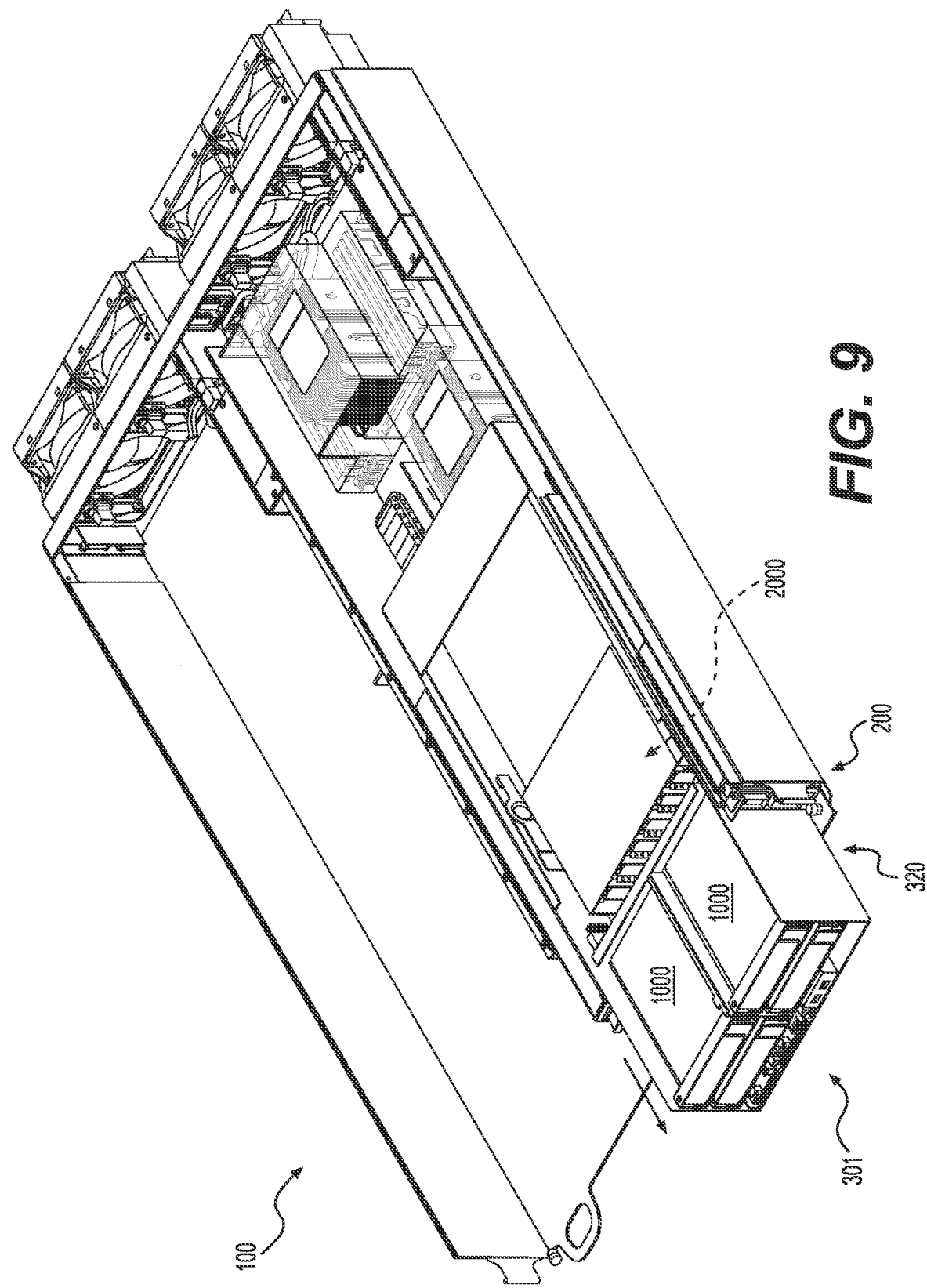
FIG. 9 is a front left perspective view of the chassis structure of FIG. 1, with the first computer node being in a first withdrawn position, and with the second computer node being removed.
Figure 10:
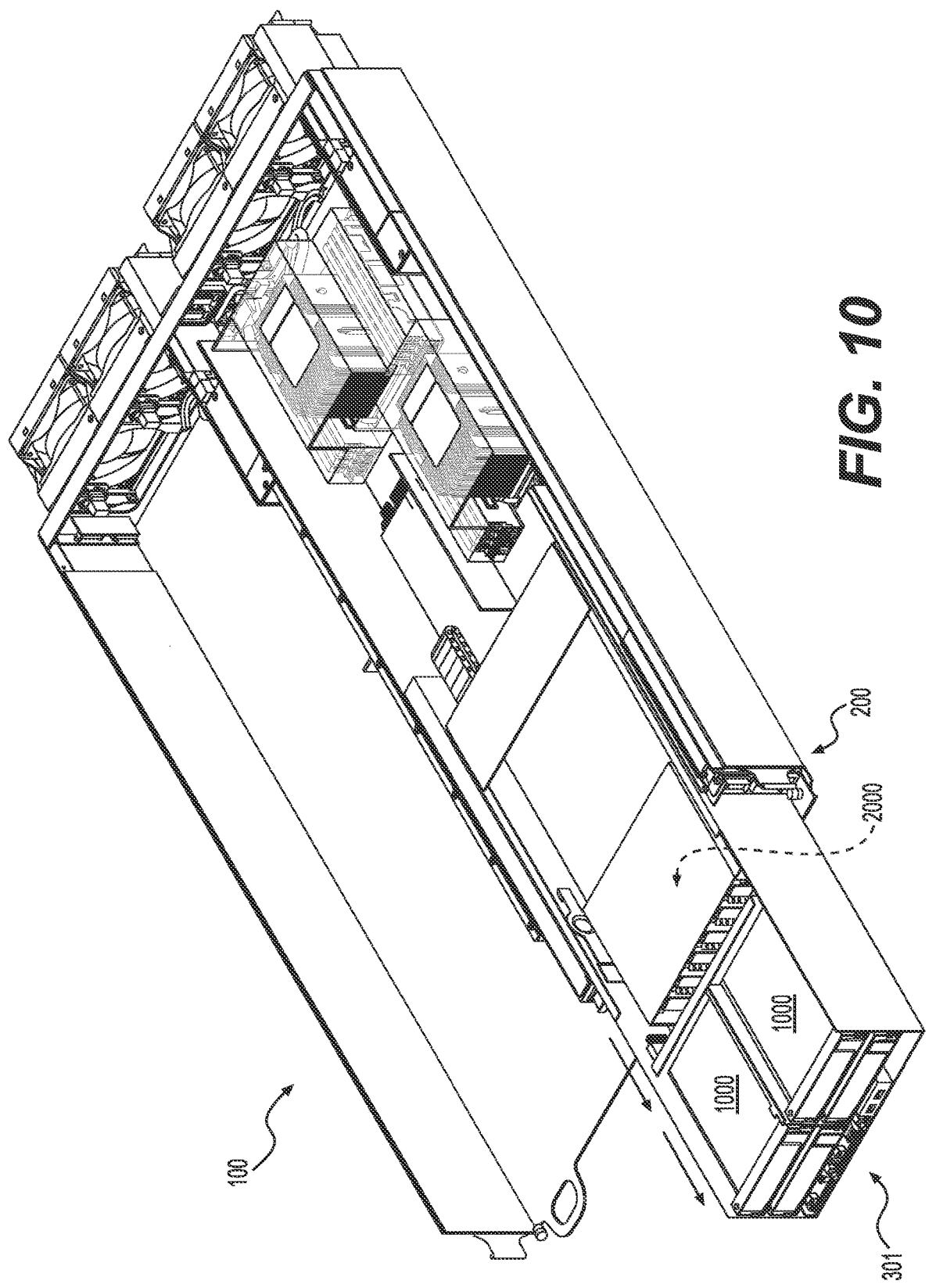
FIG. 10 is a front left perspective view of the chassis structure of FIG. 9, with the first computer node being in a second withdrawn position, and with fourth electronic components being in a stored position.

With reference to FIGS. 1, 9 and 10, it will now be described how the operator can operate the first computer node 301 of the chassis structure 100. However, it should be noted that the operator can operate the second computer node 302 in a similar manner. It is also contemplated that the operator may operate any one of the first computer node 301 and the second computer node 302 independently and/or simultaneously.

The tray frame 320 of the first computer node 301 is depicted in FIG. 1 in the received position. When the tray frame 320 is the received position, the first electronic components 1000 are accessible only from the front of the tray frame 320, while the fourth electronic components 2000 are inaccessible.

It is contemplated that when the tray frame 320 is in the received position, the tray frame 320 may be locked in the received position by a locking mechanism (not depicted). When the tray frame 320 is in the received position and the locking mechanism is in a released position, the locking mechanism may be preventing slideable movement of the tray frame 320 from the received position to first withdrawn position. When the operator actuates the locking mechanism, the locking mechanism may be moved to an actuated position and the locking mechanism no longer prevents slideable movement of the tray frame 320 from the received position to the first withdrawn position.

The tray frame 320 comprises a tray handle 290, which protrudes forwardly of the chassis 100. The operator pulls on the tray handle 290 so as to slideably move the tray frame 320 away from the chassis 200. Indeed, the sliding assembly 325 allows a longitudinal and slideable movement of the tray frame 320 away from the chassis 200 when the operator pulls on the tray handle 290.

The operator can continue to pull on the tray handle 290 until the tray frame 320 reaches the first withdrawn position such as depicted in FIG. 9. When the tray frame 320 reaches the first withdrawn position, the operator has access to the first electronic components 100 through the top access opening 322 of the tray frame 320. However, when the tray frame 320 reaches the first withdrawn position, the operator does not have access to the fourth electronic components 2000. For example, when the chassis structure 100 is installed in the server rack 1200 (See FIG. 12), an other chassis structure (not numbered) disposed immediately above the chassis structure 100 may prevent access to the second electronic components 200 when the tray frame 320 is in the first withdrawn position. Nevertheless, having access to the first electronic components 1000 through the top access opening 322 in the first withdrawn position allows repair and maintenance of any one of the first electronic components 1000 without inadvertently disconnecting any one of the fourth electronic components 2000.

The operator can disconnect any one of the first electronic components 100 when the tray frame 320 is in the first withdrawn position. Once a given first electronic component 1000 is disconnected, the operator can remove the given first electronic component 1000 from the tray frame 320 through the top access opening 322 of the tray frame 320. The operator can install into the tray frame 320 a replacement first electronic component in lieu of the given first electronic component 1000 that was removed.

The operator can pull again on the tray handle 290 forwardly away from the chassis 200 while the tray frame 320 is in the first withdrawn position. By pulling according to a threshold force on the tray handle 290 forwardly away from the chassis 200 while the tray frame 320 is in the first withdrawn position, the operator applies sufficient force on the sliding assembly 325 and longitudinally and slideably moves the tray frame 320 from the first withdrawn position towards the second withdrawn position. The tray frame 320 is depicted in the second withdrawn position in FIG. 10.

When the tray frame 320 is in the second withdrawn position, the operator has access to the first electronic components 1000 and to the fourth electronic components 2000 of the tray frame 320 through the top access opening 322 of the tray frame 320.

The operator can release the tray handle 290 and can remove from the tray frame 320 any one of the first electronic components 1000 and the fourth electronic components 2000 using both hands while avoiding removal of the first computer node 301 from the chassis 200.

In order to remove any one of the fourth electronic components 2000 while the tray frame 320 is in the second withdrawn position, the operator can reach under the ducting structure 2001 and disconnect the any one of the fourth electronic components 2000 from the tray frame 320. Once a given fourth electronic component 2000 is disconnected, the operator can remove the given fourth electronic component 2000 from the tray frame 320 through the top access opening 322 of the tray frame 320.

The operator can install into the tray frame 320 a replacement second electronic component in lieu of the given second electronic component that was removed. To that end, the operator can position the replacement second electronic component under the ducting structure 2001 and connect the replacement second electronic component where the given second electronic component that was removed was connected.

Developers of the present technology have realised that, although the fourth electronic components 2000 are accessible through the top access opening when the tray frame 320 is in the second withdrawn position, replacing a given one of the fourth electronic components 2000 may be difficult due to the lack of space for user's hand for reaching under the ducting structure 2001 for disconnecting a given second electronic component.

Figure 11:
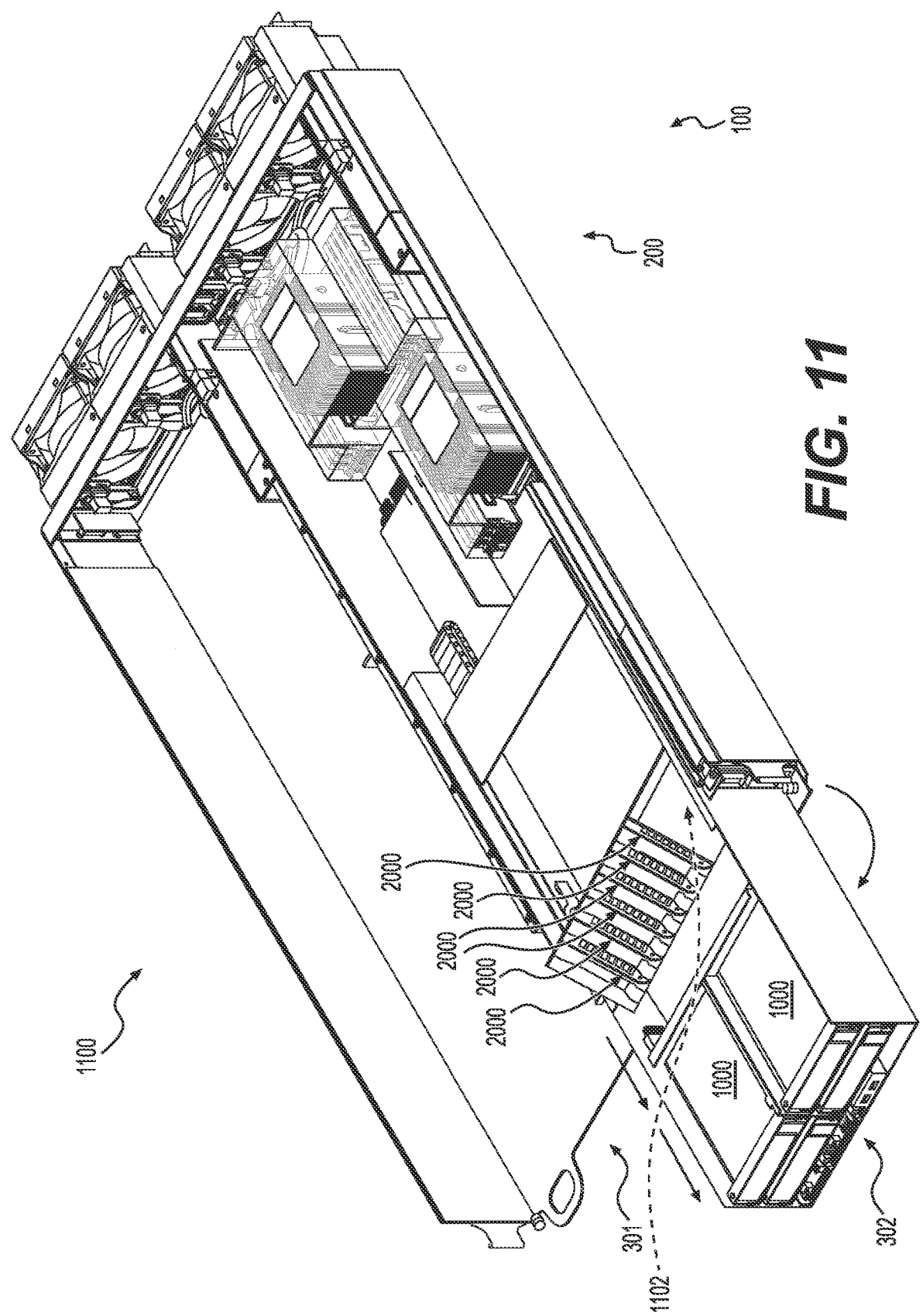
FIG. 11 is a front left perspective view of the chassis structure of FIG. 10, with fourth electronic components being in an easy-access position.

To that end, developers of the present technology have devised a latching assembly 1102 that allows pivotably moving the fourth electronic components 2000 and the ducting structure 2001 from a received position, such as depicted in FIG. 10, to an easy-access position, such as depicted in FIG. 11.

When the tray frame 320 is in the second withdrawn position, the operator may press on top of the ducting structure 2001 which provides a force for actuating the latching assembly 1102 under the fourth electronic components 2000. Once the latching assembly 1102 is actuated, the latching assembly 1102 pivotably moves a front end of the fourth electronic components 2000 and the front of the ducting structure 2001 away from the tray frame 320 and into the easy-access position. When the fourth electronic components 2000 are in the easy-access position, the operator has more room for reaching under the ducting structure 2001 for disconnecting a given fourth electronic component and for replacing it as described above.

The operator then pushes on top of the ducting structure 2001 towards the tray frame 320, which provides force for the latching assembly 1102 to pivotably move the front end of fourth electronic components 2000 and the front of the ducting structure 2001 towards the tray frame 320 and into the received position as depicted in FIG. 10.

It is contemplated that other assemblies, other than the latching assembly 1102, may be used for pivotably moving the fourth electronic components 2000 between the received position and the easy-access position. Irrespective of a specific assembly used for pivotably moving the fourth electronic components 2000 between the received position and the easy-access position, the fourth electronic components 2000 in the stored position are parallel to the top access opening 322, while in the easy-access position, the fourth electronic components 2000 are at an angle with the top access opening 322 so as to provide more room for the operator to perform maintenance and/or replacement of any one of the fourth electronic components 2000.

The operator can push on the tray handle 290 towards the chassis 200 while the tray frame 320 is in the second withdrawn position. By pushing according to the threshold force on the tray handle 290 towards the chassis 200, the operator applies sufficient force on the sliding assembly 325 which longitudinally and slideably moves the tray frame 320 from the second withdrawn position towards the first withdrawn position. The operator can push on the tray handle 290 until the tray frame 320 reaches the first withdrawn position such as depicted in FIG. 9.

The operator can push again on the tray handle 290 towards the chassis 200 while the tray frame 320 is in the first withdrawn position. By pushing according to the threshold force on the tray handle 290 towards the chassis 200 while the tray frame 320 is in the first withdrawn position, the operator applies sufficient force on the sliding assembly 325 which longitudinally and slideably moves the tray frame 320 from the first withdrawn position towards the received position.

Cooling

Figure 7:
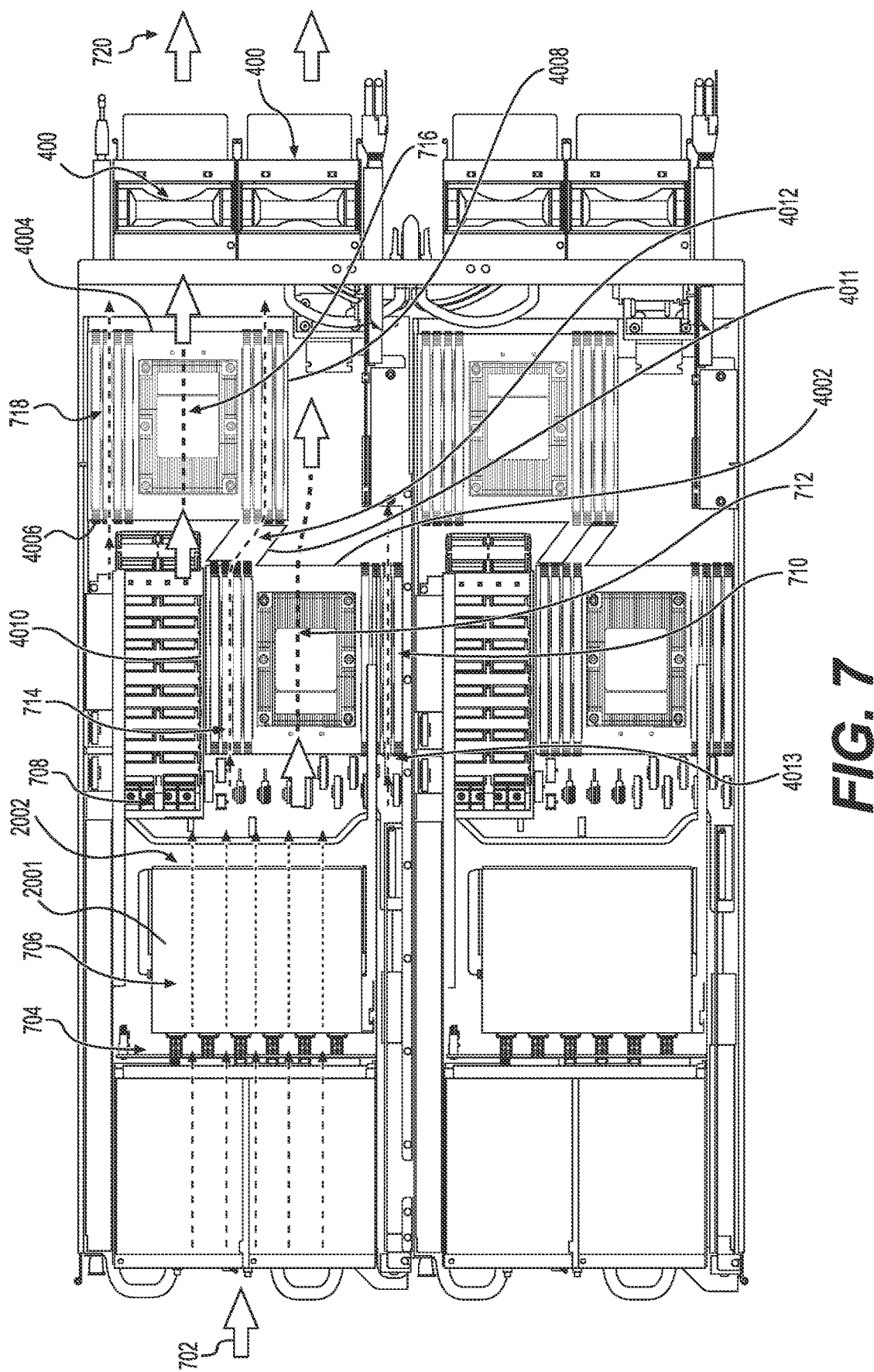
FIG. 7 is a top plane view of the chassis structure of FIG. 1, with different portions of fluid flow during operation.
Figure 8:
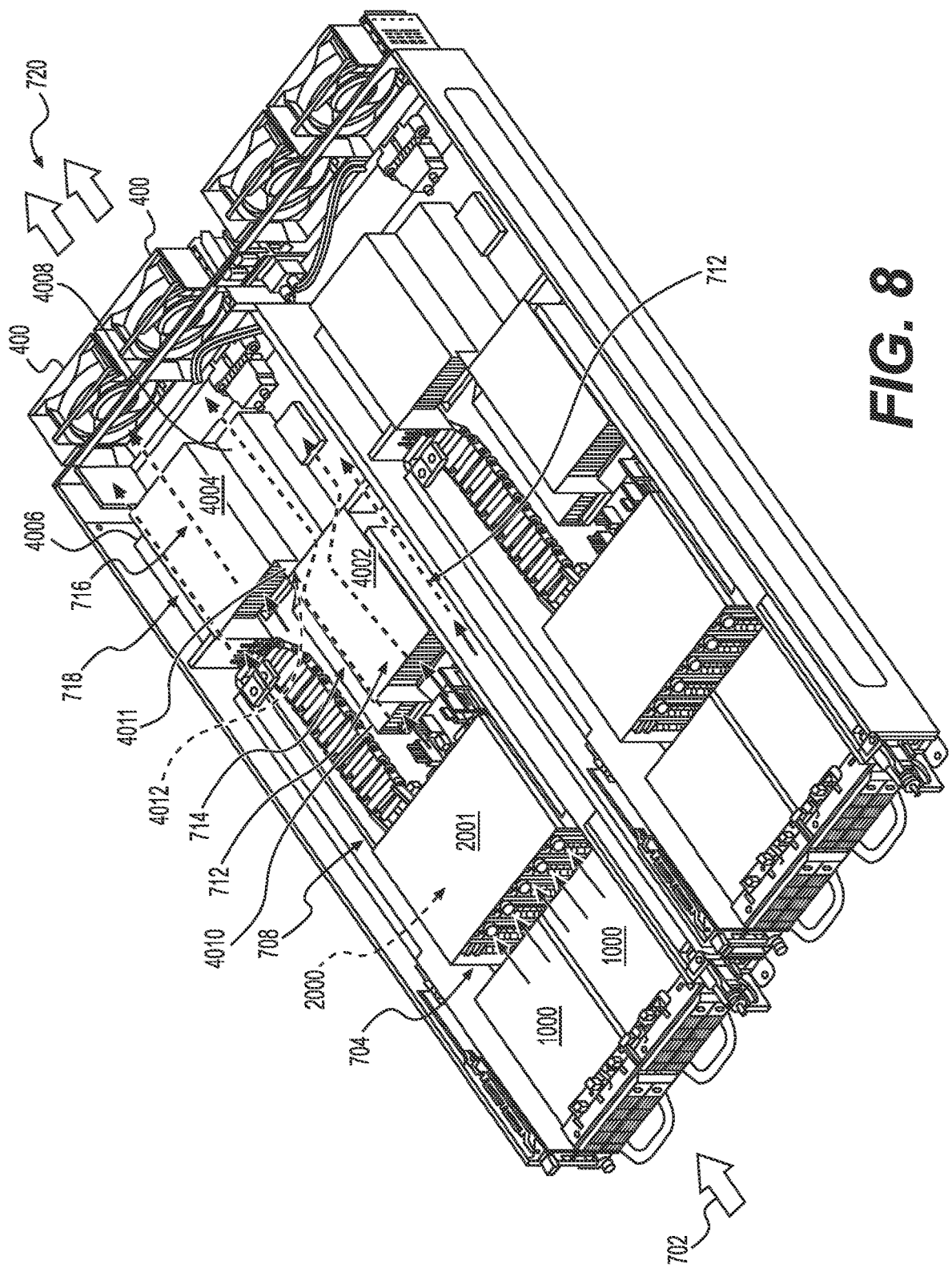
FIG. 8 is a back right perspective view of the chassis structure of FIG. 7.

How cooling of at least some electronic components inside the second computer node 302 occurs during operation of the second computer node 302 will now be described with reference to both FIGS. 7 and 8. However, it should be noted that the cooling of at least some electronic components inside the first computer node 301 may be occurring during operation of the first computer node 301 in a similar manner.

When the fans 400 are in operation, the fans 400 produce a fluid flow through the chassis structure 100. For example, when the fans 400 are in operation, ambient air (fluid) enters the front end of the tray frame 320 at ambient temperature, as illustrated by an arrow 702. Once the fluid enters the front end of the tray frame 320, the fluid flow is guided over and around the first electronic components 1000. The fluid flow allows cooling the first electronic components 1000. Once the fluid passes the first electronic components 1000, the fluid passes through a region 704 of the tray frame 320 located in between the first electronic components 1000 and the fourth electronic components 2000. The fluid passing through the region 704 has a higher temperature than the temperature of the fluid when entering the tray frame 320. The fluid is then guided by the ducting structure 2001 over and around the fourth electronic components 2000. It should be noted that the back-facing apertures 2002 of the ducting structure 2001 aid in providing fluid channels 706 in between the fourth electronic components 2000. It is contemplated that spacing in between the back-facing apertures 2002 may correspond to spacing in between the fourth electronic components 2000. Also, the back-facing apertures 2002 allow distributing the fluid flow evenly when the fluid reaches a region 708 of the second computer node 302 which is immediately behind the ducting structure 2001. The fluid passing through the region 708 has a higher temperature than the temperature of the fluid in the region 704.

The fluid in the region 708 flows backwardly towards the fans 400. It should be noted that ducting structures in the back portion 316 of the body 304 of the second computer node 302 allow splitting the fluid flow into more than one portions and guide the more than one portions over different electronic components located in the back portion 316.

As illustrated, a first portion 710 of the fluid flow is guided by the ducting structure 4013 from the front end, over, and towards the back end of the third electronic component 3203. A second portion 712 of the fluid flow is guided by the ducting structure 4002 from the front end, over, and towards the back end of the second front electronic component 3105.

A third portion 714 of the fluid flow is guided by the ducting structure 4010 from the front end, over, and towards the back end of the third electronic component 3205. The third portion 714 is then guided by the ducting structure 4012 towards the ducting structure 4008. Then, the third portion 714 is guided from the front end, over, and towards the back end of the third electronic component 3206. It should be noted that the ducting structure 4012 has a vertically extending barrier wall 4011 that extends upwardly away from the ducting structure 4012 such that the height of the ducting structure 4012 with the vertically extending barrier wall 4011 matches the height of the second computer node 302.

A fourth portion 716 of the fluid flow is guided by the ducting structure 4004 from the front end, over, and towards the back end of the second back electronic component 3100. A fifth portion 718 of the fluid flow is guided by the ducting structure 4006 from the front end, over, and towards the back end of the third electronic component 3200.

It should be noted that the offset between the ducting structure 4010 and the ducting structure 4004 allows guiding different portions of the fluid flow over the second front electronic component 3105 and the second back electronic component 3100, respectively. For example, the lateral offset along the longitudinal axis of the chassis 200 between the second front electronic component 3105 and the second back electronic component 3100 may allow guiding different portions of the fluid flow over the second front electronic component 3105 and the second back electronic component 3100, respectively. It can be said that the staggered arrangement of the second front electronic component 3105 and the second back electronic component 3100, and of the corresponding ducting structures 4010 and 4004, may allow guiding different portions of the fluid flow over the second front electronic component 3105 and the second back electronic component 3100, respectively, which increases the cooling performance of the chassis structure 100.

Furthermore, it should be noted that the ducting structure 4012 providing fluid communication between the ducting structure 4010 and 4008 also aids guiding different portions of the fluid flow over the second front electronic component 3105 and the second back electronic component 3100, respectively. It should be noted that in addition to guiding the third portion of the fluid flow as described above, the ducting structure 4012 also functions as a fluid barrier for ensuring that the second portion 712 of the fluid flow (when exiting the ducting structure 4002) does not get mixed with the fourth portion 716 of the fluid flow (when entering the ducting structure 4004). In this case, the ducting structure 4012 providing fluid communication between the ducting structure 4010 and 4008 is a channel-like structure that vertically extends below the second front and back electronic components 3105 and 3100 and is shorter than the height of the second computer node 302. In such case, the ducting structure 4012 has the vertically extending barrier wall 4011 which extends away from the channel-like structure so as to close the vertical gap between the channel-like structure and the ceiling (not depicted) of the second computer node 302. As a result, the vertically extending barrier wall 4011 aids the ducting structure 4012 in guiding different portions of the fluid flow over the second front electronic component 3105 and the second back electronic component 3100, respectively, such that the second portion 712 is not mixed with the fourth portion 716.

It should be noted that when the second portion 712 exits the ducting structure 4002, it has a higher temperature than the fourth portion 716 when the fourth portion 716 enters the ducting structure 4004. As a result, having the second portion 712 not being mixed into the fourth portion 716 after the second portion 712 exits the ducting structure 4002 allows using fluid flow with a lower temperature for cooling the second back electronic component 3100 than the temperature of the second portion 712 when the second portion 712 exits the ducting structure 4002, thus improving the cooling performance of the chassis structure 100.

It is contemplated that in at least some embodiments of the present technology, the ducting structures 4013, 4002, 4010, 4012 (with the vertically extending barrier wall 4011), 4008, 4004, and 4006 may be integrally formed. In other words, the ducting structures 4013, 4002, 4010, 4012 (with the vertically extending barrier wall 4011), 4008, 4004, and 4006 may be manufactured as a "single-piece" ducting structure that can be positioned on the motherboard 3000 so as to be disposed over the corresponding electronic components.

In at least some embodiments of the present technology, it is contemplated that having the fans 400 removably attached to the backwall 210 is advantageous for maintenance and replacement of at least some components of the chassis structure 100. For example, having the fans 400 removably attached to the backwall 210 of the chassis 100, instead of having them attached to the back of the server rack 1200 (see FIG. 12), may allow replacing a defective fan amongst the fans 400 without disconnecting the corresponding computer node from power. That way, the corresponding computer node may continuously operate during replacement of the defective fan.

Modifications and improvements to the above-described implementations of the present technology may become apparent to those skilled in the art. The foregoing description is intended to be exemplary rather than limiting. The scope of the present technology is therefore intended to be limited solely by the scope of the appended claims.

What is claimed is:

1. A chassis structure, comprising:
   a chassis including:
      a first bottom panel;
      a first sidewall and a second sidewall longitudinally extending in the chassis and located on respective sides of the first bottom panel;
      a partition wall longitudinally extending in the chassis;
      a back wall extending between the first sidewall and the second sidewall at a back of the chassis, the back wall having apertures for allowing fluid flow between inside of the chassis and outside of the chassis;
      the first bottom panel, the first sidewall, the second sidewall, the partition wall, and the back wall defining two storage spaces in the chassis;
   a given one of the two storage spaces accommodating a computer node, the computer node including:
      a body including:
         a second bottom panel;
         a third sidewall and a fourth sidewall longitudinally extending in the body and located on respective sides of the second bottom panel;
      the body being removably stored in the given one of the two storage spaces,
      the body having a front portion and a back portion, the front portion and the back portion being disposed longitudinally sequentially in the body from a front end of the body to a back end of the body;
      a tray frame located in the front portion of the body and including a top access opening,
         the tray frame for accommodating a first electronic component;
         a sliding assembly including (i) a side of the tray frame and (ii) a corresponding one of the third sidewall and the fourth sidewall,
         the sliding assembly configured for longitudinally and slideably moving the tray frame between a received position and a withdrawn position,
      the back portion of the body including a first ducting structure and a second ducting structure,
      the back portion for accommodating a second electronic component and an other second electronic component;
         the first ducting structure disposed over the second electronic component, the first ducting structure for guiding the fluid flow over the second electronic component for cooling the second electronic component during operation;
         the second ducting structure disposed over the other second electronic component, the second ducting structure for guiding the fluid flow over the other second electronic component for cooling the other second electronic component during operation;
         the first ducting structure being offset from the second ducting structure for guiding different portions of the fluid flow over the second electronic component and the other second electronic component, respectively.

2. The chassis structure of claim 1, wherein the first electronic component has a first operation temperature and the second electronic component has a second operation temperature, the second operation temperature being above the first operation temperature.

3. The chassis structure of claim 1, wherein the first ducting structure being offset from the second ducting structure includes the first ducting structure being longitudinally offset from the second ducting structure in the body.

4. The chassis structure of claim 1, wherein the first ducting structure being offset from the second ducting structure includes the first ducting structure being laterally offset from the second ducting structure along a longitudinal axis of the body.

5. The chassis structure of claim 1, wherein the first ducting structure guides a first portion of the fluid flow over the second electronic component and the second ducting structure guides a second portion of the fluid flow over the other second electronic component,
   the back portion further including a third ducting structure,
      the third ducting structure being disposed in the back portion of the body so as to prevent fluid communication between the first portion of the fluid flow and the second portion of the fluid flow.

6. The chassis structure of claim 5, wherein the third ducting structure has a vertically extending wall, the vertically extending wall being a fluid barrier for preventing fluid communication between the first portion of the fluid flow and the second portion of the fluid flow.

7. The chassis structure of claim 5, wherein the third ducting structure is disposed longitudinally in between the second electronic component and the other second electronic component.

8. The chassis structure of claim 5 wherein the first ducting structure, the second ducting structure and the third ducting structure are integrally formed.

9. The chassis structure of claim 1, wherein the chassis structure is configured to be accommodated in a server rack.

10. The chassis structure of claim 9, wherein at least one of the chassis structure and the server rack further includes a fan,
    the fan for generating the fluid flow (i) from a front end of the chassis, (ii) towards a back end of the chassis and (iii) towards the outside of the chassis.

11. The chassis structure of claim 10, wherein the fan is longitudinally aligned with the apertures and is removably attached to the back wall.

12. The chassis structure of claim 1, wherein the back portion of the body further has a motherboard, the second electronic component being electrically coupled to and located on the motherboard.

13. The chassis structure of claim 12, wherein the motherboard is configured for electrically coupling external storage devices.

14. The chassis structure of claim 12, wherein the motherboard includes a DC converter for operating under at least one of a first voltage and a second voltage.

15. The chassis structure of claim 14, wherein the tray frame is further for accommodating a fourth electronic component disposed longitudinally sequentially in the tray frame after the first electronic component.

16. The chassis structure of claim 15, wherein the withdrawn position includes a first withdrawn position and a second withdrawn position, and wherein the fourth electronic component is accessible through the top access opening only in the second withdrawn position.

17. The chassis structure of claim 15, wherein the tray frame further includes a latching assembly for pivotably moving the fourth electronic component from a stored position to an easy-access position,
the fourth electronic component in the stored position being parallel to the top access opening,
the fourth electronic component in the easy-access position being at an angle with the top access opening.

18. The chassis structure of claim 15, wherein a fourth ducting structure is located in the tray frame and disposed over the fourth electronic component, the fourth ducting structure including a plurality of back-facing apertures for distributing the fluid flow.

19. The chassis structure of claim 1, wherein the computer node includes a network port, the network port for acquiring processable tasks to be processed by the second electronic component, the network port being located on a given side of the tray frame and facing a front of the chassis structure.

20. The chassis structure of claim 1, wherein the withdrawn position includes a first withdrawn position and a second withdrawn position, and wherein the first electronic component is accessible through the top access opening in the first withdrawn position and the second withdrawn position.

* * * * *